POWER AMPLIFIER HAVING OVERLOAD PROTECTION MEANS
Filed Nov. 9, 1967
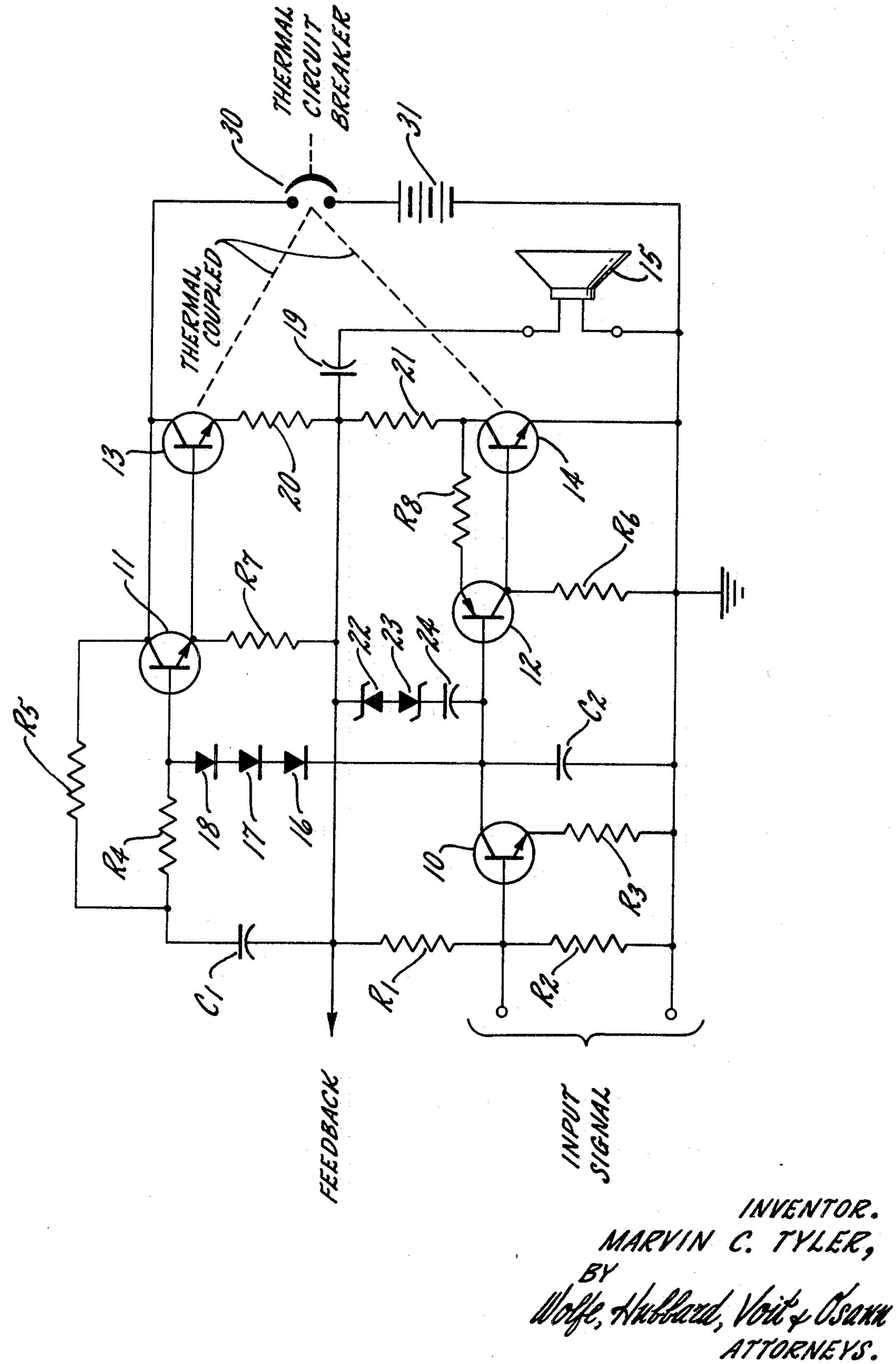
INVENTOR.
MARVIN C. TYLER,
BY
Wolfe, Hubbard, Voit & Osann
ATTORNEYS.

3,512,097
POWER AMPLIFIER HAVING OVERLOAD PROTECTION MEANS

Marvin C. Tyler, St. Joseph, Mich., assignor to Heath Company, St. Joseph, Mich., a corporation of Delaware Filed Nov. 9, 1967, Ser. No. 683,433
Int. Cl. H03f 3/18, 3/42
U.S. Cl. 330—11 11 Claims

ABSTRACT OF THE DISCLOSURE

A transistor power amplifier circuit having means for protecting the transistors from a short circuit or severe overload by automatically clamping the input voltage at a predetermined level to limit the overload current in the output circuit to a non-destructive level. In the illustrated circuit, a pair of oppositely facing Zener diodes monitor the current in a resistor in the output circuit. If a predetermined overload current flows through the resistor, the Zener diodes clamp the input voltage at a level which prevents any further increase in the output current. To protect the transistor against sustained overload as limited by the clamping means, a thermal circuit breaker is connected between the transistor and the power source and is thermally coupled to the transistor.

The present invention relates generally to power amplifiers and, more particularly, to an improved transistor power amplifier circuit adapted to protect the transistor therein from damage due to short circuits, severe overloads and the like.

Heretofore, a variety of devices such as fuses, electromagnetic circuit breakers, and thermal circuit breakers have been used to prevent the damaging or destruction of power amplifier transistors by excessive output currents due to short circuits or severe overloads, for example. However, each of these devices has the disadvantage of a delay time between the commencement of the overload and the braking of the circuit. And, as is well understood by those with practical experience in this art, a transistor can be seriously damaged or even destroyed during this period of delay.

It is, therefore, a primary object of the present invention to provide an improved transistor power amplifier circuit having means for protecting the transistors therein from damage due to short circuits, severe overloads, or the like. More particularly, it is an object of this invention to provide such a protective means which automatically and instantaneously limits the output current in response to a predetermined overload condition.

Another object of the invention is to provide an improved transistor power amplifier of the foregoing type which automatically restores the amplifier to its operative condition as soon as the predetermined overload condition ceases. Thus, it is a more specific object of the invention to provide such an amplifier which does not require resetting or replacement of the protective device after an overload condition has been encountered.

It is a further object of the invention to provide such an improved transistor power amplifier in which the protective device is simple and economical and thus does not substantially increase the cost of the circuit. Another related object is to provide such an amplifier in which the protective device is extremely reliable.

Other objects and advantages of the invention will become apparent from the following detailed description and upon reference to the accompanying drawings, in which the single figure is a circuit diagram of a transistor power amplifier embodying the present invention.

While the invention will be described in connection with certain preferred embodiments, it will be understood that it is not intended to limit the invention to these particular embodiments. On the contrary, it is intended to cover all alternatives, modifications, and equivalent arrangements as may be included within the spirit and scope of the invention as defined by the appended claims.

Turning now to the drawing, there is illustrated a power amplifier circuit suitable for use in one channel of a stereo system, for example. The input signal, which may be derived from a suitable preamplifier circuit for example, is applied to the base of a predriver transistor 10. The resulting amplified signal appearing at the collector of the predriver transistor 10 is passed from the predriver stage through a quasi-complementary output circuit, including a pair of driver transistors 11 and 12 and a pair of output transistors 13 and 14, and applied to a speaker 15. More particularly, the signal from the collector of the predriver transistor 10 is direct coupled to the base of the one driver transistor 12, and through diodes 16, 17 and 18 to the base of the other driver transistor 11. The forward voltage drop across the diodes 16, 17 and 18 provides the bias voltage required to operate the driver and output stages of the amplifier in class AB.

In the particular circuit illustrated, a positive-going signal applied to the base of the transistor 11 causes this driver transistor to conduct, which in turn causes the output transistor 13 to conduct, charging capacitor 19 through the voice coil of the speaker. Negative-going signals cause the driver transistor 12 and output transistor 14 to conduct, thereby discharging capacitor 19 back through the speaker voice coil. As is well understood by those skilled in the art, this alternate charging and discharging of capacitor 19 through the speaker voice coil converts the electrical signal back to sound.

In the circuit described thus far, the occurrence of a short circuit or a severe overload could result in an excessive output current which would permanently damage one or more of the transistors. In the past, attempts have been made to protect power amplifier transistors from this type of damage by the use of various types of circuit breaking devices which disconnect the transistor from its source of power when the output current increases to a destructive level. However, as mentioned previously, the response time of such devices is often too long to provide adequate protection for the amplifier transistors. That is, the transistor may be damaged in the delay interval between commencement of the overload condition and the breaking of the circuit, due to the relatively slow response of the protective device.

In accordance with the present invention, instantaneous protection for amplifier transistors is provided by clamping means operatively connected between the input and output circuits of the transistors for automatically responding to an overload current in the output circuit to clamp the input voltage at a predetermined level, thereby limiting the overload current to a non-destructive level. To protect the transistors from a sustained overload at the level determined by the limiting action of the clamping means, a circuit breaking means is connected in circuit with the transistor and its source of power for automatically disconnecting the transmittor from its power source in response to a predetermned condition representing a sustained overload. Thus, in the particular embodiment illustrated, a pair of resistors 20 and 21 are connected in the output circuits of the two output transistors 13 and 14, and a pair of oppositely facing Zener diodes 22 and 23 are connected between the input circuits of the two transistors and the resistors 20 and 21 in the output circuits thereof. The back-to-back Zener diodes 22, 23 which are connected in series with a D.C. blocking capactor 24, serve to monitor the output currents passing hrough the resistors 20, 21 and automatically clamp the nput voltage at a predetermined level if the monitor cur-ent increases to a predetermined overload level.

More particularly, the back-to-back Zener diodes 22, !3 are connected at one end to the collector of the pre-lriver transistor 10, i.e., in the inputs to the two driver ransistors 11, 12, and at the other end to a common point )etween the two output resistors 20, 21. During normal )peration of the circuit, the Zener diodes 22, 23 are essen-ially non-conductive and, therefore, have no effect on he circuit. However, if the output current through either esistor 20 or 21 increases to a predetermined overload evel, the increase in voltage across the resistor renders he corresponding reverse-biased Zener diode 22 or 23 :onductive, thereby clamping the input voltage to the lriver transistors 11, 12 at a predetermined level which )revents any further increase in the output current through esistors 20 and 21. In otherwords, the Zener diodes 22, !3 are selected to have a breakdown voltage correspond-ng to a predetermined overload condition in the output :ircuits containing the resistors 20, 21 so that the input 'oltage to the driver transistors 11, 12 is clamped at a evel which prevents any damage to the transistors 11–14 lue to a further increase in the overload current.

It will be appricated that the Zener diodes 22, 23 do not )reak the circuit to the transistors, but simply clamp the nput voltage at a preselected level which limits the output :urrent to a level which will not instantaneously damage he transistors. That, is the transistors will not be damaged )y the overload current, as limited by the action of the Zener diodes 22, 23, unless the load condition is sustained 'or some period. In the particular circuit illustrated, the )ack-to-back pair of Zener diodes 22, 23 protects all four ransistors 11–14 in the driver and output stages of the )ower amplifier, but it will be understood that more or less transistors could be protected by the same diode pair n other circuit arrangements.

In order to protect the amplifier transistors from dam-ige due to a sustained overload at the level determined )y the pair of Zener diodes 22, 23, a circuit breaker 30 is :onnected in circuit with the transistors and their power ;ource 31. In the illustrative embodiment of the inven-:ion, the circuit breaker 30 is of the thermal type and s thermally coupled (indicated by broken lines in the lrawing) to the output transistors 13, 14 so as to monitor :he transistor temperature. While the thermal coupling )etween the circuit breaker 30 and the transistors 13, 14 may be effected in a number of different ways, one suit-ible method is to mount the circuit breaker on the heat sinks of the transistors 13, 14.

The purpose of the thermal circuit breaker 30 is to iutomatically disconnect the amplifier transistors from :heir source of power in response to an increase in the :emperature of at least one of the output transistors 13, 14 to a predetermined level which indicates that the limit-ed overload condition has been sustained for a period which might damage the transistors. Thus if the temper-ature of either output transistor 13 or 14 increases to the predetermined level due to the persistence of the limited overload current, the circuit breaker 30 automatically )pens the circuit between the transistors and their power ;ource. When the temperature of the transistors has re-:urned below the predetermined level, the circuit breaker 30 automatically closes again to restore the connnection )etween the transistors and the power source 31 so as to :eturn the amplifier circuit to its normal operating con-lition.

It will be understood that circuit breaking devices other :han the thermal circuit breaker described above can be itilized in the present invention. For example, the circuit )reaker could be responsive to an excessive output cur-'ent rather than the temperature of the transistors. Re-;ardless of the particular type of circuit breaker utilized, it is important to note that the function of the circuit breaker is only to protect the amplifier transisors from damage due to a sustained overload as limited by the Zener diodes 22, 23, since the overload is limited in the first instance by the action of the Zener diodes 22, 23.

The following is a list of the values employed for the various circuit elements in a preferred embodiment of the illustratice circuit, including those elements that were not specifically mentioned in the foregoing descripton because they are conventional and well known to those skilled in the art, but which have been identified by appropriate reference characters in the accompanying drawing to permit correlation with the values given in this example:

Resistor R1—33000.
Resistor R2—2200 ohms.
Resistor R3—270 ohms.
Resistor R4—4700 ohms.
Resistor R5—1000 ohms.
Resistor R6—100 ohms.
Resistor R7—100 ohms.
Resistor R8—4.7 ohms.
Resistor 20—0.67 ohm, 5 watts.
Resistor 21—0.67 ohm, 5 watts.
Capacitor C1—50 mf.
Capacitor C2—330 pf.
Capacitor 24—100 μf.
Capacitor 19—4000 μf.
Diodes 16, 17, 18—1N3754.
Zener diodes 22, 23—1N4653.
Transistor 10—40408 (RCA).
Transistor 11—40409 (RCA).
Transistor 12—40410 (RCA).
Transistor 13, 14—40411 (RCA).

As can be seen from the foregoing detailed description, this invention provides an improved transistor power amplifier circuit which includes protective means for preventing damage to the amplifier transistors due to instantaneous and/or sustained overload currents. The clamping means which is operatively connected between the input and output circuits of the transistor continuously monitors the output current and automatically and instantaneously clamps the input voltage at a predetermined level in response to a predetermined overload current thereby limiting the output current to a non-destructive level. Protection against sustained overloads is provided by the circuit breaker which disconnects the transistor from its power source in response to a predetermined condition, such as a preselected transistor temperature, representing a sustained overload. The protective devices automatically restore the amplifier to its operative condition as soon as the overload conditions cease, so that no resetting or replacement of the protective device is required after an overload condition has been encountered. Moreover, the protective devices provided by this invention are simple and economical and, therefore, do not substantially increase the cost of the circuit. Furthermore, the protection provided by both the clamping means and the circuit breaker are extremely reliable.

I claim as my invention:

1. An overload current protected transistor power amplifier circuit comprising the combination of a transistor having an input circuit for coupling thereto an input voltage and an output circuit, a source of power, clamping means operatively connected between said input and output circuits for automatically responding to an overload current in said output circuit to clamp the input voltage at a predetermined level to limit the overload current in said output circuit to an initially non-destructive level, and circuit breaking means connected to provide a direct current circuit path coupling between said transistor and said source of power and operative to automatically break the circuit path between said transistor and said source of power in response to a predetermined condition representing a sustained limiting of the overload current in said output circuit.

2. A transistor power amplifier circuit as defined in claim 1 in which said circuit breaking means is thermally coupled to said transistor for automatically breaking the circuit path between said transistor and said source of power in response to an increase in the temperature of the transistor to a predetermined level due to a prolonged limiting of the overload current in said output circuit.

3. A transistor power amplifier circuit as defined in claim 1 in which said clamping means comprises a pair of oppositely facing zener diodes connected between the input and output circuits of said transistor.

4. A transistor power amplifier circuit as defined in claim 1 in which said clamping means comprises a resistor in the output circuit of said transistor and a pair of oppositely facing zener diodes connected across said transistor and said resistor.

5. A transistor power amplifier circuit as defined in claim 1 in which said clamping means comprises a pair of back-to-back zener diodes connected between the input and output circuits of said transistor, and a D.-C. blocking capacitor connected in series with said diodes.

6. A transistor power amplifier circuit as defined in claim 1 in which said circuit breaking means comprises a thermal circuit breaker thermally coupled to said transistor for automatically breaking the circuit path between said transistor and said source of power in response to an increase in the temperature of the transistor to a predetermined level due to a prolonged limiting of the overload current in said output circuit, and adapted to automatically close the circuit path between said transistor and said source of power when the transistor temperature returns below said predetermined level.

7. A transistor power amplifier circuit comprising the combination of a driver stage including at least one driver transistor and an input circuit for coupling thereto an input voltage, an output stage including at least one output transistor operatively connected to said driver stage and an output circuit, a source of power, clamping means operatively connected between said input and output circuits for automatically responding to an overload current in said output circuit to clamp the input voltage in said input circuit at a predetermined level to limit the overload current in said output circuit to an initially non-destructive level, and circuit breaking means connected to provide a direct current circuit path coupling between said source of power and said driver and output transistors and operative to automatically break the circuit path between said transistors and said source of power in response to a predetermined condition representing a sustained limiting of the overload current in said output circuit.

8. A transistor power amplifier circuit as defined in claim 7 in which said clamping means comprises a pair of oppositely facing Zener diodes connected between said input and output circuits.

9. A transistor power amplifier circuit as defined in claim 7 in which said clamping means comprises a resistor in said output circuit and a pair of opopsitely facing Zener diodes connected across said driver and output transistors and said resistor.

10. A transistor power amplifier circuit comprising the combination of a first pair of operatively connected driver and output transistors for receiving positive-going input signals and producing corresponding amplified output signals, a second pair of operatively connected driver and output transistors for receiving negative-going input signals and producing corresponding amplified output signals, an input circuit for applying said input signals to said first and second pairs of transistors, an output circuit for receiving said amplified output signals from said first and second pairs of transistors, a source of power, clamping means operatively connected between said input and output circuits for automatically responding to an overload current in said output circuit to clamp the input signals in said input circuit at a predetermined level to limit the overload current in said output circuit to an initially non-destructive level, and circuit breaking means connected to provide a direct current circuit path coupling between said source of power and said driver and output transistors and operative to automatically break the circuit path between said transistors and said source of power in response to a predetermined condition representing a sustained limiting of the overload current in said output circuit.

11. A transistor power amplifier circuit as defined in claim 10 in which said clamping means comprises a single pair of oppositely facing zener diodes connected between said input and output circuits.

References Cited

UNITED STATES PATENTS

| | | | |
|---|---|---|---|
| 2,672,530 | 3/1954 | Ensink | 330—102 |
| 2,832,900 | 4/1958 | Ford | 307—202 X |
| 3,051,852 | 8/1962 | Mintz et al. | 307—202 |
| 3,185,934 | 5/1965 | Patmore et al. | 330—19 |
| 3,200,346 | 8/1965 | Young | 330—110 |

OTHER REFERENCES

Electronics, "Low-Cost Transistor Overload Safety Circuit," by "Redmond," p. 102, Oct. 14, 1960.

NATHAN KAUFMAN, Primary Examiner

U.S. Cl. X.R.

307—202; 330—13, 14, 24, 26